(12) United States Patent
DeBrosse et al.

(10) Patent No.: US 8,370,714 B2
(45) Date of Patent: Feb. 5, 2013

(54) REFERENCE CELLS FOR SPIN TORQUE BASED MEMORY DEVICE

(75) Inventors: John K. DeBrosse, Essex Junction, VT (US); Daniel C. Worledge, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 12/684,486

(22) Filed: Jan. 8, 2010

(65) Prior Publication Data
US 2011/0173513 A1 Jul. 14, 2011

(51) Int. Cl.
*G11C 29/00* (2006.01)
*G11C 11/00* (2006.01)

(52) U.S. Cl. ......... 714/766; 714/718; 714/769; 365/148

(58) Field of Classification Search ................. None
See application file for complete search history.

(56) References Cited

U.S. PATENT DOCUMENTS

| | | | |
|---|---|---|---|
| 6,055,178 A * | 4/2000 | Naji .................. | 365/158 |
| 6,704,230 B1 | 3/2004 | DeBrosse et al. | |
| 7,286,429 B1 * | 10/2007 | Liaw et al. ............ | 365/209 |
| 7,852,665 B2 * | 12/2010 | Chen et al. ........... | 365/158 |
| 8,023,299 B1 * | 9/2011 | Gharia ................. | 365/49.1 |
| 8,040,713 B2 * | 10/2011 | Chen et al. ........... | 365/148 |
| 8,055,988 B2 * | 11/2011 | Lam .................... | 714/803 |
| 8,122,329 B2 * | 2/2012 | Kong et al. ........... | 714/785 |
| 2003/0023922 A1 | 1/2003 | Davis et al. | |
| 2003/0023924 A1 * | 1/2003 | Davis et al. ........... | 714/763 |
| 2005/0030799 A1 * | 2/2005 | Smith et al. .......... | 365/199 |
| 2007/0297223 A1 | 12/2007 | Chen et al. | |
| 2009/0067212 A1 * | 3/2009 | Shimizu ............... | 365/148 |
| 2009/0125787 A1 | 5/2009 | Sakimura et al. | |
| 2009/0141544 A1 | 6/2009 | Sakimura et al. | |
| 2010/0080071 A1 * | 4/2010 | Huang et al. .......... | 365/189.14 |

FOREIGN PATENT DOCUMENTS
WO WO2006112049 A1 10/2006

OTHER PUBLICATIONS

Asao et al.;, "A Statistical Model for Assessing the Fault Tolerance of Variable Switching Currents for a 1Gb Spin Transfer Torque Magnetoresistive Random Access Memory," Defect and Fault Tolerance of VLSI Systems, 2008. DFTVS '08. IEEE International Symposium on ,vol., no., pp. 507-515, Oct. 1-3, 2008.*
Kawahara, T.; Takemura, R.; Miura, K.; Hayakawa, J.; Ikeda, S.; Young Min Lee; Sasaki, R.; Goto, Y.; Ito, K.; Meguro, T.; Matsukura, F.; Takahashi, H.; Matsuoka, H.; Ohno, H.; , "2 Mb SPRAM (SPin-Transfer Torque RAM) With Bit-by-Bit Bi-Directional Current Write and Parallelizing-Direction Current Read," Solid-State Circuits, IEEE Journal of , vol. 4.*
International Search Report; International Application No. PCT/US 11/20009; International Filing Date: Jan. 3, 2011; Date of Mailing: Mar. 13, 2012; pp. 1-5.
International Search Report—Written Opinion; International Application No. PCT/US 11/20009; International Filing Date: Jan. 3, 2011; Date of Mailing: Mar. 13, 2012; pp. 1-4.

* cited by examiner

*Primary Examiner* — Ajay Bhatia
*Assistant Examiner* — Daniel McMahon
(74) *Attorney, Agent, or Firm* — Cantor Colburn LLP; Vazken Alexanian

(57) ABSTRACT

A method of reading and correcting data within a memory device that includes reading each data bit of a data word using a plurality of reference cells corresponding to each data bit, performing error detection on the read data bits, and correcting a read data bit when an error is detected using error correction code (ECC) and writing each corresponding reference cells to an original memory state thereof.

9 Claims, 5 Drawing Sheets

REFERENCE CELLS FOR SPIN TORQUE BASED MEMORY DEVICE

BACKGROUND

The present invention relates to magnetic random access memory, and more specifically, to reference cells for spin-torque based memory devices.

A spin torque magnetic random access memory (MRAM) device uses a spin-torque based memory element, for example, including a pinned layer, a tunnel barrier layer and a free layer in a magnetic tunnel junction (MTJ) stack. The magnetization of the pinned layer is fixed in a direction such that when current passes through the MTJ stack, the free layer becomes either parallel or anti-parallel to the pinned layer. Resistance of the MTJ stack depends on the relative orientation of the free layer and the pinned layer. When the free layer is parallel to the pinned layer, the MTJ stack is in a low resistance state (e.g., a "1" memory state) and when they are anti-parallel, the MTJ stack is in a high resistance state (e.g., a "0" memory state).

During the reading of data, a small current flows through the MTJ stack and its resistance is compared with a pre-written MTJ cell called a reference cell, to determine whether the MTJ stack being read is in a high or low resistance state. Reference cells are typically prewritten to be set to "0" memory state and "1" memory state. A problem associated with spin-torque memory devices is that the act of reading the reference cell may disturb the data. In order to read the resistance of the reference cell, current is passed through the reference cell and the voltage across them is measured. This current may accidently write the reference bit causing a "read" disturb.

SUMMARY

The present invention provides a method for determining errors and writing the offending bit that is in error and its corresponding reference cells to obviate the problem mentioned above.

According to one embodiment of the present invention, a computer-implemented method of reading and correcting data within a memory device is provided. The method includes reading each data bit of a data word using a plurality of reference cells corresponding to each data bit, performing error detection on the read data bits, and correcting a read data bit when an error is detected using error correction code (ECC) and writing each corresponding reference cells to an original memory state thereof.

According to another embodiment of the present invention, a computer-implemented method of reading and correcting data within a memory device is provided. The method includes reading each data bit of a data word using a plurality of reference cells corresponding to each data bit, and writing the corresponding reference cells to an original memory state thereof, after reading each respective data bit.

According to yet another embodiment of the present invention, a computer-implemented method of reading and correcting data within a memory device is provided. The method includes reading each data bit of a data word and corresponding reference cells, performing error detecting on each data bit, and correcting a respective data bit when an error is detected and correcting a memory state of a corresponding reference cell when it is determined that the corresponding reference cell is in an opposite memory state.

In additional embodiments of the present invention, computer program products implementing the above-mentioned methods are also provided.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
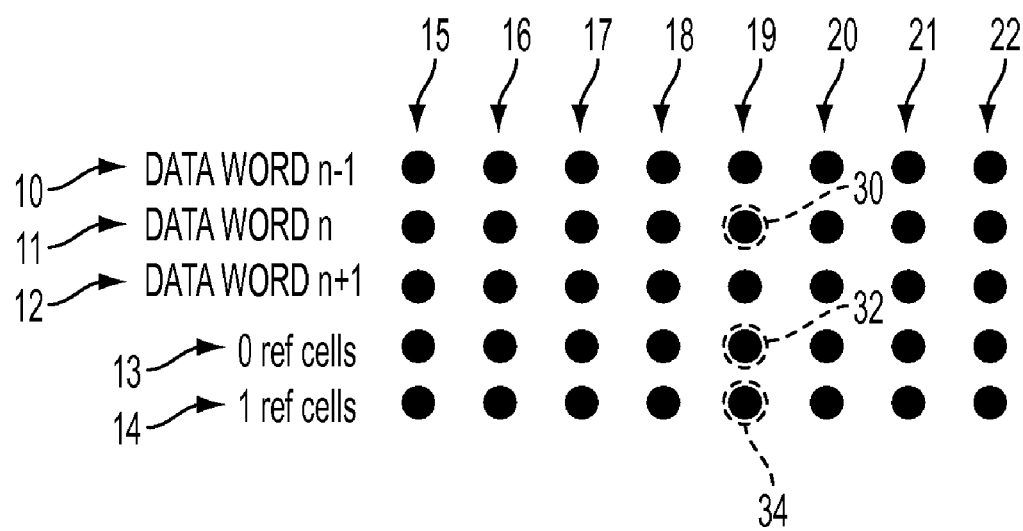
FIG. 1 is a chart illustrating a memory array that can be implemented within embodiments of the present invention.

As shown in FIG. 1, according to an embodiment of the present invention, a memory array 100 including plurality of rows 10-12 and columns 15-22 is provided. In the plurality of rows 10-12, each row 10-12 is a data word representing for example, data bits and error correction code (ECC) check bits. The ECC check bits are used to correct any errors found in the data bits when reading the data. The first row 10 represents data word n−1, the second row 11 represents data word n and the third row 12 represents data word n+1. A second plurality of rows 13 and 14 is provided. In the second plurality of rows 13 and 14, each represents reference cells. Row 13 represents reference cells preset at a "0" memory state (e.g., a high resistance state) and row 14 represents reference cells preset at "1" memory state (e.g., a low resistance state).

According to an embodiment of the present invention, when reading the data, the resistance of the first data bit of a particular word, for example, data word n in row 11, is compared with the resistance of the "0" reference cell and the "1" reference cell within the same column 14, and the resistance of the second data bit is then compared to the resistance of the "0" reference cell and the "1" reference cell within the same column 15, for example. Thus, according to an embodiment of the present invention, every data bit and ECC check bit has a corresponding "0" reference cell and "1" reference cell to use to read them out. Further, as shown in FIG. 1, when reading out the data, an error is found in the data word n at the data bit in column 19 (indicated by the circle 30). The offending data bit 30 is rewritten along with the corresponding "0" reference cell 32 and the "1" reference cell 34. The "0" reference cell is written to a "0" memory state and the "1" reference cell is written to a "1" memory state.

Figure 2:
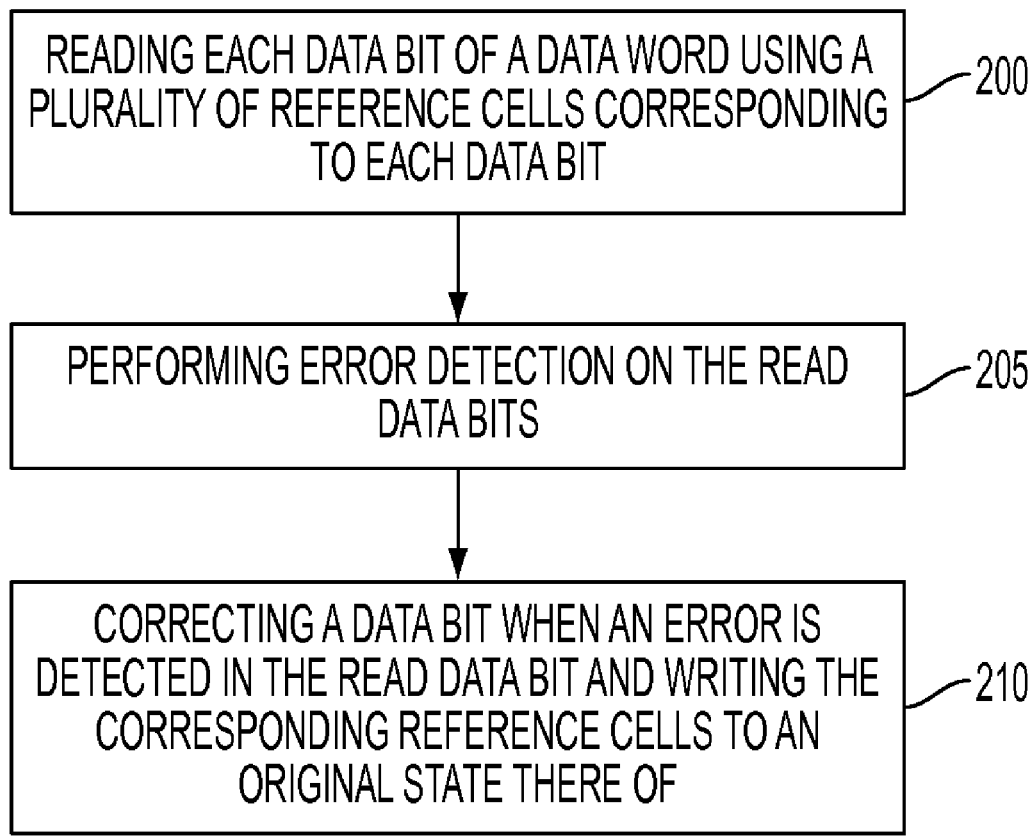
FIG. 2 is a flowchart illustrating a method of reading and correcting data in a spin-torque based memory device that can be implemented within alternative embodiments of the present invention.

FIG. 2 is a flowchart illustrating a method for reading and correcting data within a spin-torque based memory device that can be implemented within embodiments of the present invention. As shown in FIG. 2, the method begins at operation 200, where each data bit of a data word is read using reference cells corresponding to each data bit. From operation 200, the process continues to operation 205 where error detection is performed on the read data bits. From operation 205, the process moves to operation 210, where error correction is performed on a read data bit using error correction code (ECC) when an error is detected in the read data bit and the corresponding reference cells are written to an original memory state thereof.

According to an embodiment of the present invention, at operation 200, the data bit is read by comparing a resistance of the data bit to a resistance of each of the corresponding reference cells.

Figure 3:
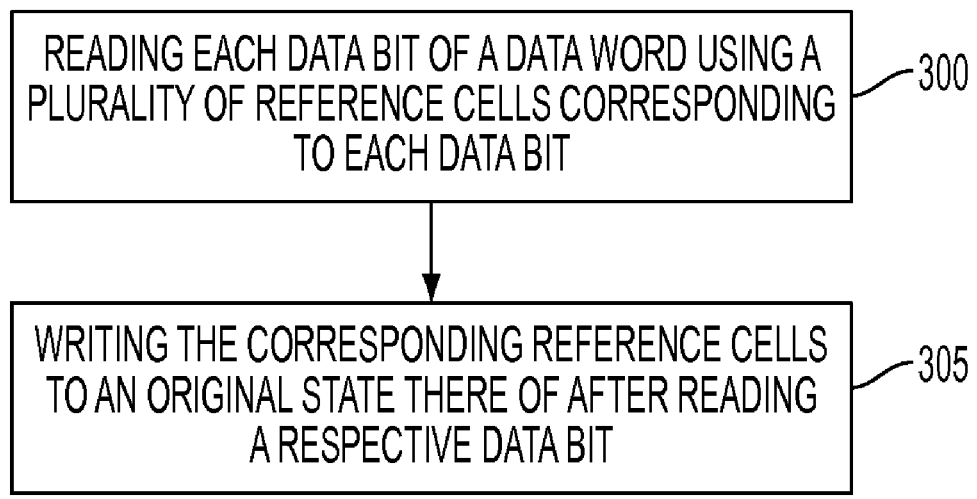
FIG. 3 is a flowchart illustrating a method of reading and correcting data in a spin-torque based memory device that can be implemented within alternative embodiments of the present invention.
Figure 4:
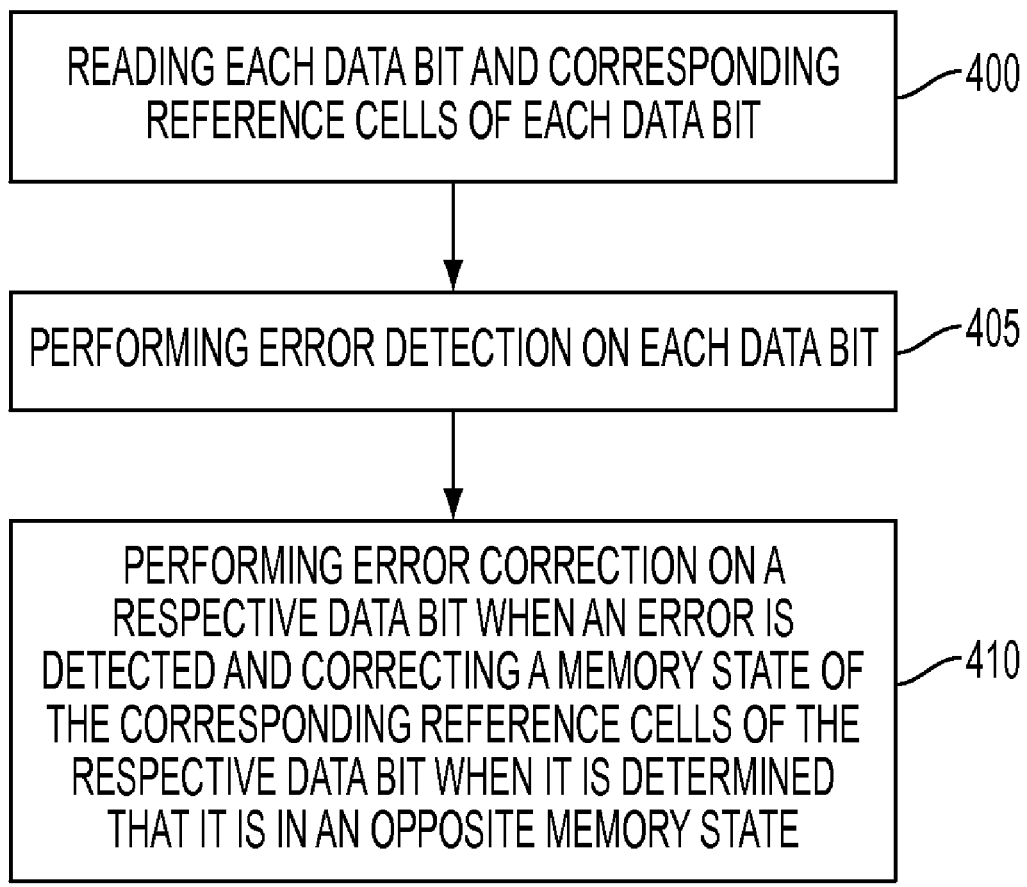
FIG. 4 is a flowchart illustrating a method of reading and correcting data in a spin-torque based memory device that can be implemented within alternative embodiments of the present invention.

According to an embodiment of the present invention, the plurality of reference cells includes reference cells having "0" memory states and reference cells having "1" memory states where each data bit has a corresponding reference cell written to a "0" and a corresponding reference cell written to a "1". The present invention is not limited to a particular method of reading and correcting data within a spin-torque based memory device. FIGS. 3 through 4 illustrate methods of reading and correcting data in spin-torque based memory devices that can be implemented within alternative embodiments of the present invention.

FIG. 3 is a flowchart illustrating a method of reading and correcting data in a spin-torque based memory device that can be implemented within alternative embodiments of the present invention. As shown in FIG. 3, in operation 300, each data bit of a data word is read using a plurality of reference cells corresponding to each data bit. From operation 300, the process moves to operation 305 where, after the reading of a respective data bit, the corresponding reference cells are written an original memory state thereof. According to an embodiment of the present invention, a reference cell originally written to a "0" memory state is written back to a "0" memory state and a reference cell originally written to a "1" memory state is written back to a "1" memory state. In the current embodiment, all of the reference cells are written after every read.

FIG. 4 is a flowchart illustrating a method of reading and correcting data in a spin-torque based memory device that can be implemented within alternative embodiments of the present invention. As shown in FIG. 4, at operation 400, each data bit and corresponding reference cells are read. From operation 400, the process moves to operation 405 where error detection is performed on each data bit. From operation 405 the process moves to operation 410 where error correction is performed on a respective data bit when an error is detected and a correction of a memory state of a corresponding reference cell is performed only when it is determined that the corresponding reference cell is in an opposite memory state.

Figure 5:
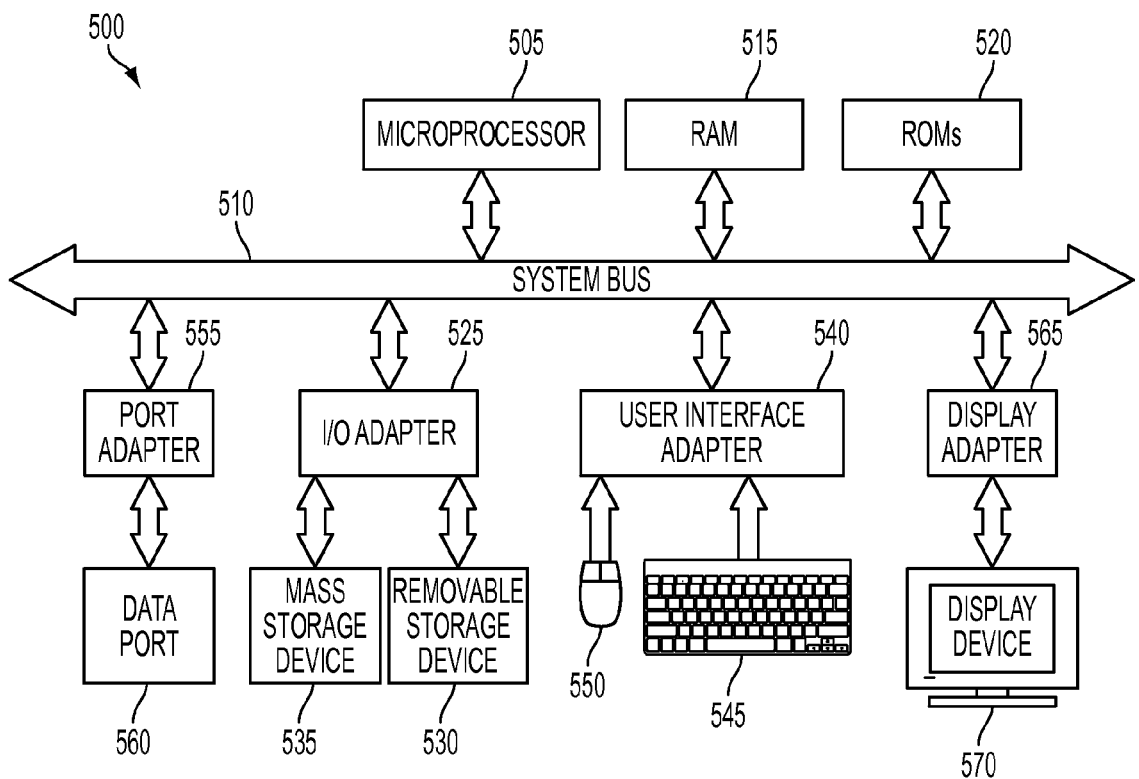
FIG. 5 is a diagram illustrating an apparatus for implementing the methods shown in FIG. 1 through 4 that can be implemented within embodiments of the present invention.

FIG. 5 is a diagram illustrating an apparatus for implementing the methods shown in FIG. 1 through 4 that can be implemented within embodiments of the present invention. As shown in FIG. 5, the method described herein is practiced with a general-purpose computer and the method may be coded as a set of instructions on removable or hard media for use by the general-purpose computer. In FIG. 5, a computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 855 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

In view of the above, the present method embodiment may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above.

Embodiments of the present invention provides methods for reading and correcting data within a spin torque based memory device while minimizing read disturbs that may be caused by the reading of reference cells when performing a data read operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer-implemented method of reading and correcting data within a memory device, the method comprising:
    reading each data bit of a data word where each data bit of the data word is associated with a corresponding first reference cell and as second reference cell, the first reference cell is continuously associated with a 0 memory state and the second reference cell is continuously associated with a 1 memory state, by comparing each bit of the data word to the corresponding first reference cell the corresponding second reference cell;
    performing error detection on the read data bits;
    correcting a read data bit when an error is detected using error correction code (ECC);
    writing each corresponding first reference cell associated with each data bit of the data word to a 0 memory state responsive to correcting the read data bit when the error is detected using ECC; and
    writing each corresponding second reference cell associated with each data bit of the data word to a 1 memory state responsive to correcting the read data bit when the error is detected using ECC.

2. The computer-implemented method of claim 1, wherein the memory device is a spin-torque based memory device.

3. The computer-implemented method of claim 1, wherein reading each data bit comprises comparing a resistance of each data bit to a resistance of each of the corresponding reference cells.

4. A computer program product comprising a non-transitory computer useable medium including a computer readable program, wherein the computer readable program when performed on a computer causes the computer to implement a method of reading and correcting data within a memory device, the method comprising:
    reading each data bit of a data word where each data bit of the data word is continuously associated with a corresponding first reference cell and as second reference cell, the first reference cell is continuously associated with a 0 memory state and the second reference cell is associated with a 1 memory state, by comparing each bit of the data word to the corresponding first reference cell the corresponding second reference cell;
    performing error detection on the read data bits;
    correcting a read data bit when an error is detected using error correction code (ECC);
    writing each corresponding first reference cell associated with each data bit of the data word to a 0 memory state responsive to correcting the read data bit when the error is detected using ECC; and
    writing each corresponding second reference cell associated with each data bit of the data word to a 1 memory state responsive to correcting the read data bit when the error is detected using ECC.

5. The computer program product of claim 4, wherein the memory device is a spin-torque based memory device.

6. The computer program product of claim 4, wherein reading each data bit comprises comparing a resistance of each data bit to a resistance of each of the corresponding reference cells.

7. A computer memory system controlled by a processor operative to:
    read each data bit of a data word of the memory system where each data bit of the data word is associated with a corresponding first reference cell and as second reference cell, the first reference cell is associated with a 0 memory state and the second reference cell is associated with a 1 memory state, by comparing each bit of the data word to the corresponding first reference cell the corresponding second reference cell;
    performing error detection on the read data bits;
    correcting a read data bit when an error is detected using error correction code (ECC);
    writing each corresponding first reference cell associated with each data bit of the data word to a 0 memory state responsive to correcting the read data bit when the error is detected using ECC; and
    writing each corresponding second reference cell associated with each data bit of the data word to a 1 memory state responsive to correcting the read data bit when the error is detected using ECC.

8. The system of claim 7, wherein the memory device is a spin-torque based memory device.

9. The system of claim 7, wherein reading each data bit comprises comparing a resistance of each data bit to a resistance of each of the corresponding reference cells.

* * * * *